US011476421B2

(12) United States Patent
Kamo et al.

(10) Patent No.: US 11,476,421 B2
(45) Date of Patent: Oct. 18, 2022

(54) ORGANIC ELECTRONICS MATERIAL AND ORGANIC ELECTRONICS ELEMENT

(71) Applicant: HITACHI CHEMICAL COMPANY, LTD., Tokyo (JP)

(72) Inventors: Kazuyuki Kamo, Tsukuba (JP); Iori Fukushima, Tsukuba (JP); Ryota Moriyama, Hitachi (JP); Shunsuke Kodama, Yokohama (JP); Naoki Asano, Tsukuba (JP); Hirotaka Sakuma, Hitachinaka (JP)

(73) Assignee: SHOWA DENKO MATERIALS CO., LTD., Tokyo (JP)

( * ) Notice: Subject to any disclaimer, the term of this patent is extended or adjusted under 35 U.S.C. 154(b) by 369 days.

(21) Appl. No.: 16/628,156

(22) PCT Filed: Jul. 4, 2018

(86) PCT No.: PCT/JP2018/025362
§ 371 (c)(1),
(2) Date: Jan. 2, 2020

(87) PCT Pub. No.: WO2019/009327
PCT Pub. Date: Jan. 10, 2019

(65) Prior Publication Data
US 2020/0161556 A1 May 21, 2020

(30) Foreign Application Priority Data
Jul. 4, 2017 (JP) .............................. JP2017-131159

(51) Int. Cl.
*H01L 51/00* (2006.01)
*C08G 61/12* (2006.01)
*H01L 51/50* (2006.01)

(52) U.S. Cl.
CPC .......... *H01L 51/0035* (2013.01); *C08G 61/12* (2013.01); *H01L 51/0043* (2013.01); *C08G 2261/12* (2013.01); *C08G 2261/95* (2013.01); *H01L 51/0003* (2013.01); *H01L 51/5056* (2013.01); *H01L 51/5072* (2013.01)

(58) Field of Classification Search
None
See application file for complete search history.

(56) References Cited

U.S. PATENT DOCUMENTS

2009/0026448 A1\* 1/2009 Meyer ................. H01L 51/0003
257/E51.001
2015/0263288 A1 9/2015 Funyuu et al.

FOREIGN PATENT DOCUMENTS

| CN | 1849717 A | 10/2006 |
|---|---|---|
| DE | 102006006412 A1 | 8/2007 |
| EP | 3106485 A1 | 12/2016 |
| JP | 2000-036390 A | 2/2000 |
| JP | 2003-213002 A | 7/2003 |
| JP | 2005-075948 A | 3/2005 |
| JP | 2008-276130 A | 11/2008 |
| JP | 2009-176963 A | 8/2009 |
| JP | 2010-067959 A | 5/2010 |
| WO | 2005/024971 A1 | 3/2005 |
| WO | 2010/140553 A | 12/2010 |

OTHER PUBLICATIONS

Endo, A., Ogasawara, M., Takahashi, A., Yokoyama, D., Kato, Y. and Adachi, C. (2009), Thermally Activated Delayed Fluorescence from Sn4+-Porphyrin Complexes and Their Application to Organic Light Emitting Diodes—A Novel Mechanism for Electroluminescence. Adv. Mater., 21: 4802-4806. doi:10.1002/adma.200900983 (Cited in Specification).
Endo, A., Sato, K., Yoshimura, K., Kai, T., Kawada, A., et al. (2011) Efficient up-conversion of triplet excitons into a singlet state and its application for organic light emitting diodes. Appl. Phys. Lett. 98, 083302 ; doi: 10.1063/1.3558906 (Cited in Specification).
Nakagawa, T., Ku, S., Wong, K., Adachi, C. Electroluminescence based on thermally activated delayed fluorescence generated by a spirobifluorene donor-acceptor structure. Chem. Commun., 48, 9580-9582 (2012) (Cited in Specification).
Lee, S., Yasuda, T., Nomura, H., and Adachi, C. High-efficiency organic light-emitting diodes utilizing thermally activated delayed fluorescence from triazine-based donor-acceptor hybrid molecules Appl. Phys. Lett. 101, 093306 (2012); doi: 10.1063/1.4749285 (Cited in Specification).
Zhang, Q., Li, J., Shizu, K,. Huang, S., Hirata, S., Miyazaki, H., and Adachi, C. Design of Efficient Thermally Activated Delayed Fluorescence Materials for Pure Blue Organic Light Emitting Diodes. J. Am. Chem. Soc., 134, 14706 (2012) (Cited in Specification).
Tanaka, H., Shizu, K., Miyazakiab, H., and Adachi, C. Efficient green thermally activated delayed fluorescence (TADF) from a phenoxazine-triphenyltriazine (PXZ-TRZ) derivative. Chem. Comm., 48, 11392 (2012) (Cited in Specification).
Uoyama, H., Goushi, K., Shizu, K., Nomura, H., and Adachi, C. Highly efficient organic light-emitting diodes from delayed fluorescence. Nature, 492, 234 (2012) (Cited in Specification).
Li, J., Nakagawa, T., MacDonald, J., Zhang, Q., Nomura, H., Miyazaki, H., and Adachi, C. Highly Efficient Organic Light-Emitting Diode Based on a Hidden Thermally Activated Delayed Fluorescence Channel in a Heptazine Derivative. Adv. Mater., 25, 3319 (2013) (Cited in Specification).

(Continued)

*Primary Examiner* — Tanisha Diggs
(74) *Attorney, Agent, or Firm* — Fitch, Even, Tabin & Flannery, LLP

(57) ABSTRACT

One embodiment relates to an organic electronic material containing a charge transport polymer, wherein the charge transport polymer is a polymer which, when 25 μL portions of methanol are added dropwise and stirred into 1,000 μL of a solution containing the charge transport polymer and toluene in a ratio of 20 mg of the charge transport polymer per 2,290 μL of toluene, the amount of methanol added by the time cloudiness develops in the solution is greater than 350 μL.

18 Claims, 2 Drawing Sheets

(56) References Cited

OTHER PUBLICATIONS

Ishimatsu, R., Matsunami, S., Shizu, K., Adachi, C., Nakano, K., and Imato, T. Solvent Effect on Thermally Activated Delayed Fluorescence by 1,2,3,5-Tetrakis(carbazol-9-yl)-4,6-dicyanobenzene J. Phys. Chem. A, 117, 5607 (2013) (Cited in Specification).

Serevicius, T., Nakagawa, T., Kuo, M., Cheng, S., Wong, K., Chang, C., Kwong, R. C., Xiae, S., and Adachi, C. Enhanced electroluminescence based on thermally activated delayed fluorescence from a carbazole-triazine derivative. Phys. Chem. Chem. Phys., 15, 15850 (2013) (Cited in Specification).

Nasu, K., Nakagawa, T., Nomura, H., Lin, C., Cheng, C., Tseng, M., Yasudaad, T., and Adachi, C. A highly luminescent spiro-anthracenone-based organic light-emitting diode exhibiting thermally activated delayed fluorescence Chem. Comm., 49, 10385 (2013) (Cited in Specification).

Li, B., Nomura, H., Miyazaki, H., Zhang, Q., Yoshida, K., Suzuma, Y., Orita, A., Otera, J., Adachi, C. Dicarbazolyldicyanobenzenes as Thermally Activated Delayed Fluorescence Emitters: Effect of Substitution Position on Photoluminescent and Electroluminescent Properties. Chem. Lett., 43, 319 (2014) (Cited in Specification).

\* cited by examiner

ORGANIC ELECTRONICS MATERIAL AND ORGANIC ELECTRONICS ELEMENT

CROSS-REFERENCE TO RELATED APPLICATIONS

This application is a U.S. national phase application filed under 35 U.S.C. § 371 of International Application No. PCT/JP2018/025362, filed Jul. 4, 2018, designating the United States, which claims priority from Japanese Patent Application No. 2017-131159, filed Jul. 4, 2017, which are hereby incorporated herein by reference in their entirety.

TECHNICAL FIELD

Embodiments of the present invention relate to an organic electronic material, an ink composition, an organic layer, an organic electronic element, an organic electroluminescent element (organic EL element), a display element, an illumination device, and a display device.

BACKGROUND ART

Organic EL elements are attracting attention for potential use, for example, in large-surface area solid state lighting applications to replace incandescent lamps or gas-filled lamps. Further, organic EL elements are also attracting attention as the leading self-luminous display for replacing liquid crystal displays (LCD) in the field of flat panel displays (FPD), and commercial products are becoming increasingly available.

Depending on the organic materials used, organic EL elements are broadly classified into two types: low-molecular weight type organic EL elements and polymer type organic EL elements. In polymer type organic EL elements, a polymer compound is used as the organic material, whereas in low-molecular weight type organic EL elements, a low-molecular weight compound is used. On the other hand, the production methods for organic EL elements are broadly classified into dry processes in which film formation is mainly performed in a vacuum system, and wet processes in which film formation is performed by plate-based printing such as relief printing or intaglio printing, or by plateless printing such as inkjet printing. Because wet processes enable simple film formation, they are expected to be an indispensable method in the production of future large-screen organic EL displays.

Accordingly, much development of materials suitable for wet processes is being pursued, and for example, investigations are being undertaken into the formation of multilayer structures using compounds having polymerizable groups (for example, see Patent Literature 1).

CITATION LIST

Patent Literature

PLT 1: WO 2010/140553

SUMMARY OF INVENTION

Technical Problem

Organic EL elements produced using wet processes have the advantages of facilitating cost reductions and increases in the surface area. In wet processes, favorable solubility in coating solvents is sometimes desirable. Further, if application to plastic films is considered, then depending on the intended application, a material that cures at low temperature may be desirable.

An embodiment of the present invention has an object of providing an organic electronic material that can ensure a broad process margin in wet processes. Further, other embodiments of the present invention have the objects of providing an ink composition that is suitable for wet processes, as well as an organic layer, an organic electronic element, an organic EL element, a display element, an illumination device and a display device that exhibit excellent production efficiency.

Solution to Problem

The present invention includes various embodiments. Examples of those embodiments are described below. However, the present invention is not limited to the following embodiments.

One embodiment relates to an organic electronic material containing a charge transport polymer, wherein the charge transport polymer is a polymer which, when 25 μL portions of methanol are added dropwise and stirred into 1,000 μL of a solution containing the charge transport polymer and toluene in a ratio of 20 mg of the charge transport polymer per 2,290 μL of toluene, the amount of methanol added by the time cloudiness develops in the solution is greater than 350 μL.

According to one embodiment, the charge transport polymer described above preferably has a polymerizable functional group. It is more preferable that the charge transport polymer has, at a terminal, an aromatic ring having two polymerizable functional groups.

Another embodiment relates to an organic electronic material containing a charge transport polymer, wherein the charge transport polymer has, at a terminal, an aromatic ring having two polymerizable functional groups.

According to one embodiment, the aromatic ring having two polymerizable functional groups described above preferably includes an aromatic ring represented by a formula shown below.

[Chemical formula 1]

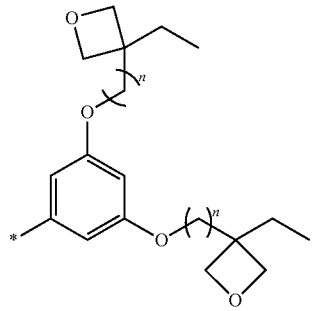

(Each n independently represents an integer of 1 to 6.)

According to one embodiment, the polymerizable functional groups preferably include at least one type of group selected from the group consisting of an oxetanyl group, an oxiranyl group, a vinyl group, an acryloyloxy group and a methacryloyloxy group.

According to one embodiment, the charge transport polymer described above is preferably a hole transport polymer.

According to one embodiment, the charge transport polymer described above preferably has a structure that is branched in three or more directions.

According to one embodiment, the charge transport polymer described above preferably has a structural unit having charge transport properties, wherein the structural unit having charge transport properties includes at least one type of structural unit selected from the group consisting of a divalent structural unit L and a trivalent or higher structural unit B.

According to one embodiment, the structural unit having charge transport properties described above preferably has at least one type of structure selected from the group consisting of an aromatic amine structure, a carbazole structure, a thiophene structure, a bithiophene structure, a benzene structure, a phenoxazine structure and a fluorene structure.

According to one embodiment, any one of the organic electronic materials described above may also contain a polymerization initiator.

According to one embodiment, the polymerization initiator preferably contains an onium salt.

Further, another embodiment relates to an ink composition containing any one of the organic electronic materials described above and a solvent.

Another embodiment relates to an organic layer formed from any one of the organic electronic materials described above or the ink composition described above.

Another embodiment relates to an organic electronic element containing the organic layer described above.

Another embodiment relates to an organic electroluminescent element containing the organic layer described above.

Moreover, other embodiments relate to a display element and an illumination device containing the organic electroluminescent element described above, and a display device containing the illumination device and a liquid crystal element as a display unit.

Advantageous Effects of Invention

The present invention is able to provide an organic electronic material that can ensure a broad process margin in wet processes. Further, other embodiments of the present invention can provide an ink composition that is suitable for wet processes, as well as an organic layer, an organic electronic element, an organic EL element, a display element, an illumination device and a display device that exhibit excellent production efficiency.

DESCRIPTION OF EMBODIMENTS

Figure 1:
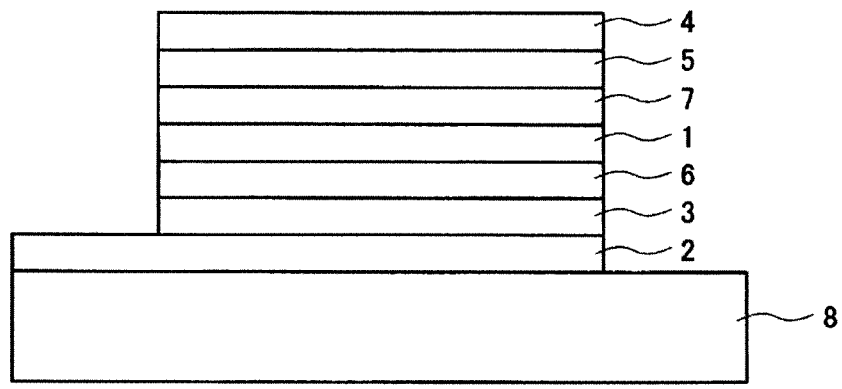
FIG. 1 is a schematic view illustrating one example of an organic EL element that represents an embodiment of the present invention.

Embodiments of the present invention are described below. The present invention is not limited to the following embodiments.
<Organic Electronic Material>
The organic electronic material contains at least a charge transport polymer. The organic electronic material may also contain optional components such as a dopant or a polymerization initiator.

[Charge Transport Polymer]
According to one embodiment, the organic electronic material contains a charge transport polymer that satisfies the following condition.

When 25 µL portions of methanol are added dropwise and stirred into 1,000 µL of a solution containing the charge transport polymer and toluene in a ratio of 20 mg of the charge transport polymer per 2,290 µL of toluene, the amount of methanol added by the time cloudiness develops in the solution is greater than 350 µL.

Confirmation of the amount of methanol is performed at room temperature (25° C.). A solution and methanol that have been adjusted to a temperature of 25° C. are used as the solution and the methanol. Further, stirring of the solution and the methanol is conducted inside a sealable container such as a sample tube. Specifically, confirmation may be made using the method described below.

The solution is prepared by dissolving 20 mg of the charge transport polymer in 2,290 µL of toluene. Subsequently, 1,000 µL (25° C.) of the obtained solution is measured into a sample tube, and 25 µL portions of methanol (25° C.) are added dropwise and stirred into the solution at room temperature (25° C.). The dropwise addition and stirring of the methanol is repeated, and the amount of methanol added by the time cloudiness develops is determined. The cloudiness is confirmed visually.

From the viewpoint of obtaining favorable solubility for the charge transport polymer, the amount of methanol is preferably greater than 350 µL, more preferably greater than 450 µL, and even more preferably greater than 500 µL. The improvement effect in the solubility manifests particularly favorably when the charge transport polymer is dissolved in an organic solvent. Examples of the organic solvent include hydrocarbon-based solvents such as toluene, xylene and hexane.

From the viewpoint of obtaining superior polymer solubility, the amount of methanol is preferably not more than 800 µL, more preferably not more than 700 µL, and even more preferably 600 µL or less.

One example of a method for obtaining a charge transport polymer for which the amount of methanol is large is a method in which, for example, a structure having a polar group such as a group containing a hetero atom is introduced into the polymer. On the other hand, one example of a method for obtaining a charge transport polymer for which the amount of methanol is small is a method in which, for example, a structure having a low-polarity group such as an alkyl group is introduced into the polymer.

In one embodiment, the charge transport polymer for which the amount of methanol is greater than 350 µL may have a polymerizable functional group. A polymerization reaction can then be used to cure the charge transport polymer and change the degree of solubility in solvents. The amount of methanol for the charge transport polymer can be adjusted by selecting a polar group or a low-polarity group as the polymerizable functional group.

The polymerizable functional group may be introduced at a terminal portion of the charge transport polymer (namely, a structural unit T described below), at a portion other than a terminal (namely, a structural unit L or B described below), or at both a terminal portion and a portion other than a terminal. From the viewpoint of the curability, the polymerizable functional group is preferably introduced at least at a terminal portion, and from the viewpoint of achieving a favorable combination of curability and charge transport properties, is preferably introduced only at a terminal portion.

In those cases where, as described below, the charge transport polymer has a branched structure, the polymerizable functional group may be introduced within the main chain of the charge transport polymer, within a side chain, or within both the main chain and a side chain.

A "polymerizable functional group" refers to a functional group which is able to form bonds upon the application of heat and/or light.

Examples of the polymerizable functional group include a group having a carbon-carbon multiple bond (such as a vinyl group, allyl group, butenyl group, ethynyl group, acryloyl group, acrylate group (acryloyloxy group), acryloylamino group, methacryloyl group, methacrylate group (methacryloyloxy group), methacryloylamino group, vinyloxy group and vinylamino group), a group having a small ring (including a cyclic alkyl group such as a cyclopropyl group and cyclobutyl group; a cyclic ether group such as an epoxy group (oxiranyl group) and oxetane group (oxetanyl group); a diketene group; an episulfide group; a lactone group; and a lactam group), and a heterocyclic group (such as a furanyl group, pyrrolyl group, thiophenyl group and silolyl group). The polymerizable functional group may have a substituent such as a methyl group or ethyl group.

Examples of preferred polymerizable functional groups include an oxetanyl group, oxiranyl group, vinyl group, acryloyloxy group and methacryloyloxy group. From the viewpoint of storage stability, an oxetanyl group is preferred. Further, by introducing an oxetanyl group, the amount of methanol can be easily adjusted.

From the viewpoints of increasing the degree of freedom associated with the polymerizable functional group and facilitating the polymerization reaction, the main skeleton of the charge transport polymer and the polymerizable functional group are preferably linked via an alkylene chain. Further, in the case where, for example, an organic layer is to be formed on an electrode, from the viewpoint of enhancing the affinity with hydrophilic electrodes of ITO or the like, the main skeleton and the polymerizable functional group are preferably linked via a hydrophilic chain such as an ethylene glycol chain or a diethylene glycol chain. Moreover, from the viewpoint of simplifying preparation of the monomer used for introducing the polymerizable functional group, the charge transport polymer may have an ether linkage or an ester linkage at the terminal of the alkylene chain and/or the hydrophilic chain, namely, at the linkage site between these chains and the polymerizable functional group, and/or at the linkage site between these chains and the charge transport polymer skeleton. Examples of a "group containing a polymerizable functional group" mentioned below include the polymerizable functional group itself, a polymerizable functional group having a substituent, or a group having a combination of an unsubstituted or substituted polymerizable functional group and an alkylene chain or the like. Examples of groups that can be used favorably as this group containing a polymerizable functional group include the groups exemplified in WO 2010/140553.

From the viewpoint of contributing to a change in the degree of solubility, the polymerizable functional group is preferably included in the charge transport polymer in a large amount. On the other hand, from the viewpoint of not impeding the charge transport properties, the amount included in the charge transport polymer is preferably kept small. The amount of the polymerizable functional group may be set as appropriate with due consideration of these factors.

For example, from the viewpoint of obtaining a satisfactory change in the degree of solubility, the number of polymerizable functional groups per molecule of the charge transport polymer is preferably at least two, and more preferably three or greater. Further, from the viewpoint of maintaining favorable charge transport properties, the number of polymerizable functional groups is preferably not more than 1,000, and more preferably 500 or fewer.

The number of polymerizable functional groups per molecule of the charge transport polymer can be determined as an average value from the amount of the polymerizable functional group used in synthesizing the charge transport polymer (for example, the amount added of the monomer having the polymerizable functional group), the amounts added of the monomers corresponding with the various structural units, and the weight average molecular weight of the charge transport polymer and the like. Further, the number of polymerizable functional groups can also be calculated as an average value using the ratio between the integral of the signal attributable to the polymerizable functional group and the integral of the total spectrum in the $^1$H NMR (nuclear magnetic resonance) spectrum of the charge transport polymer, and the weight average molecular weight of the charge transport polymer and the like. In terms of simplicity, if the amounts added of the various components are clear, then the value determined using these amounts is preferably employed.

In one embodiment, the organic electronic material contains a charge transport polymer having, at a terminal, an aromatic ring having two polymerizable functional groups. A terminal is the end of a polymer chain.

An "aromatic ring" refers to a ring that exhibits aromaticity. The aromatic ring may have a single ring structure such as benzene, or may have a condensed ring structure in which rings are fused together such as naphthalene.

The aromatic ring may be an aromatic hydrocarbon such as benzene, naphthalene, anthracene, tetracene, fluorene or phenanthrene, or may be an aromatic heterocycle such as pyridine, pyrazine, quinoline, isoquinoline, acridine, phenanthroline, furan, pyrrole, thiophene, carbazole, oxazole, oxadiazole, thiadiazole, triazole, benzoxazole, benzoxadiazole, benzothiadiazole, benzotriazole or benzothiophene.

The aromatic ring may also be a structure in which two or more independent rings selected from among single ring or condensed ring structures are bonded together, such as biphenyl, terphenyl or triphenylbenzene.

The aromatic ring is preferably an aromatic hydrocarbon. Further, the aromatic ring is preferably a single ring. A benzene ring is particularly preferred.

The "polymerizable functional group" is as described above. In the "aromatic ring having two polymerizable functional groups", the two polymerizable functional groups may be the same or different. In the "aromatic ring having two polymerizable functional groups", the polymerizable functional groups may be bonded directly to the aromatic ring, or bonded via a linking group such as an alkylene chain. In other words, the "aromatic ring having two polymerizable functional groups" may be an "aromatic ring having two groups containing a polymerizable functional group". In such an "aromatic ring having two groups containing a polymerizable functional group", the two polymerizable functional groups may be the same or different. Further, the two groups containing a polymerizable functional group may be the same or different.

In a preferred embodiment, examples of the aromatic ring having two polymerizable functional groups include the structures shown below. The aromatic ring having two polymerizable functional groups is not limited to the following structures.

[Chemical formula 1A]

Ar represents an aromatic ring, and each R independently represents a group containing a polymerizable functional group. The symbol "*" denotes a bonding site with another structure.

Ar is preferably an aromatic hydrocarbon group, and is more preferably a benzene ring. Ar may have a substituent besides the R groups, and examples of the substituent include the group R described in relation to the structural unit L (but excluding a group containing a polymerizable functional group).

R preferably contains a group selected from among a group having a carbon-carbon multiple bond and a group having a small ring, more preferably contains a group having a small ring, even more preferably contains a cyclic ether group, and particularly preferably contains an oxetane group. The R groups may be the same or different, and are preferably the same.

Examples of preferred aromatic rings having two polymerizable functional groups include the structures shown below.

[Chemical formula 1B]

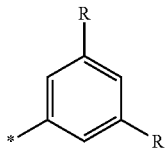

Each R independently represents a group containing a polymerizable functional group. The symbol "*" denotes a bonding site with another structure.

R preferably contains a group selected from among a group having a carbon-carbon multiple bond and a group having a small ring, more preferably contains a group having a small ring, even more preferably contains a cyclic ether group, and particularly preferably contains an oxetane group. The R groups may be the same or different, and are preferably the same.

Specific examples of the aromatic ring having two polymerizable functional groups include the structures shown below. The aromatic ring having two polymerizable functional groups is not limited to the following structures.

[Chemical formula 2]

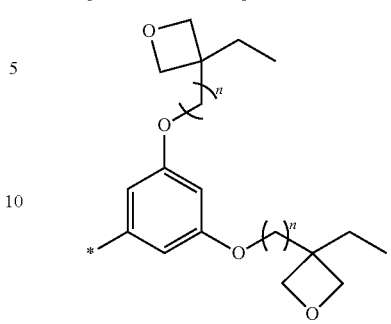

Each n independently represents an integer of 1 to 6. The symbol "*" denotes a bonding site with another structure.

A more specific example of the aromatic ring having two polymerizable functional groups is the structure shown below. The symbol "*" denotes a bonding site with another structure.

[Chemical formula 3]

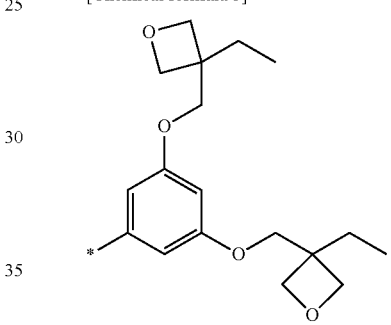

As a result of having the aromatic ring having two polymerizable functional groups at a polymer terminal, the charge transport polymer has favorable curability at low temperature. Further, as a result of having the aromatic ring having two polymerizable functional groups at a polymer terminal, the charge transport polymer also exhibits favorable solubility. In the charge transport polymer, it is thought that the aromatic ring having two polymerizable functional groups provides steric hindrance, thereby improving the solubility in solvents. However, this hypothesis does not limit the present invention.

In one embodiment, the charge transport polymer is preferably a polymer that satisfies the amount of methanol described above, and has an aromatic ring having two polymerizable functional groups at a polymer terminal.

The charge transport polymer is a polymer that has the ability to transport an electric charge. The charge transport polymer preferably has the ability to transport a positive hole. A hole transport polymer can be used, for example, as a hole injection layer and/or a hole transport layer of an organic EL element. Further, if the polymer is an electron transport polymer, then the polymer can be used, for example, as an electron transport layer and/or an electron injection layer. Furthermore, if the polymer has the ability to transport both holes and electrons, then the polymer can be used, for example, as a light-emitting layer.

The charge transport polymer may be linear or branched. A branched charge transport polymer has a structure that is branched in three or more directions. A branched charge transport polymer has a main chain and one or more branch chains (side chains), wherein each side chain has one or more structural units.

The charge transport polymer preferably contains at least a divalent structural unit L having charge transport properties and a monovalent structural unit T that forms a terminal portion of the polymer chain, and may also contain a trivalent or higher structural unit B that forms a branched portion. Further, the charge transport polymer preferably contains at least a trivalent or higher structural unit B that has charge transport properties and forms a branched portion, and a monovalent structural unit T that forms a terminal portion of the polymer chain, and may also contain a divalent structural unit L. The charge transport polymer may have only one type of each of these structural units, or may contain a plurality of types of each structural unit. In the charge transport polymer, the various structural units are bonded together at "monovalent" to "trivalent or higher" bonding sites.

The charge transport polymer preferably contains, as at least one of the structural units L and B, at least one type of structure selected from the group consisting of an aromatic amine structure, a carbazole structure, a thiophene structure, a bithiophene structure, a fluorene structure, a benzene structure and a phenoxazine structure, which may be a substituted or unsubstituted structure.

(Structure)

Examples of partial structures contained in the charge transport polymer include the structures shown below. However, the charge transport polymer is not limited to polymers having the following partial structures. In the partial structures, "L" represents a structural unit L, "T" represents a structural unit T, and "B" represents a structural unit B. In the partial structures, the plurality of L units may be the same structural units or mutually different structural units. This also applies for the T and B structural units. The symbol "*" denotes a bonding site with another structural unit. This also applies in the specific examples described below for the structural units L, T and B.

Example of Partial Structure of Linear Charge Transport Polymer

T-L-L-L-L-* [Chemical formula 4]

Examples of Partial Structures of Branched Charge Transport Polymers

[Chemical formula 5]

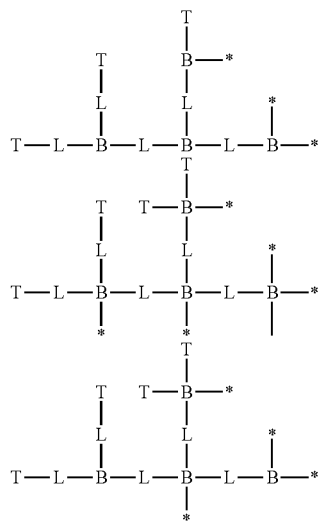

-continued $$\begin{array}{c} T \\ | \\ B-L-L-* \\ | \\ T-L-L-L-B-L-B-B-* \\ | \quad | \\ * \quad * \end{array}$$

(Structural Unit L)

The structural unit L is a divalent structural unit. The structural unit L is preferably a structural unit that has charge transport properties. There are no particular limitations on the structural unit L having charge transport properties, provided it includes an atom grouping having the ability to transport an electric charge. For example, the structural unit L may be selected from among aromatic amine structures, carbazole structures, thiophene structures, fluorene structures, phenoxazine structures, benzene structures, biphenylene structures, terphenylene structures, naphthalene structures, anthracene structures, tetracene structures, phenanthrene structures, dihydrophenanthrene structures, pyridine structures, pyrazine structures, quinoline structures, isoquinoline structures, quinoxaline structures, acridine structures, diazaphenanthrene structures, furan structures, pyrrole structures, oxazole structures, oxadiazole structures, thiazole structures, thiadiazole structures, triazole structures, benzothiophene structures, benzoxazole structures, benzoxadiazole structures, benzothiazole structures, benzothiadiazole structures and benzotriazole structures, which may be substituted or unsubstituted structures, and structures containing one type, or two or more types, of the above structures. Further, a structure containing two or more of one type of the above structures is also possible, wherein an example of a structure containing two or more structures is a bithiophene structure. The aromatic amine structures are preferably triarylamine structures, and more preferably triphenylamine structures.

In one embodiment, from the viewpoint of obtaining superior hole transport properties, the structural unit L preferably contains at least one type of structure selected from the group consisting of aromatic amine structures, carbazole structures, thiophene structures, bithiophene structures, fluorene structures, benzene structures and phenoxazine structures, which may be substituted or unsubstituted structures, and more preferably contains at least one type of structure selected from the group consisting of substituted or unsubstituted aromatic amine structures and substituted or unsubstituted carbazole structures. In another embodiment, from the viewpoint of obtaining superior electron transport properties, the structural unit L preferably contains at least one type of structure selected from the group consisting of fluorene structures, benzene structures, phenanthrene structures, pyridine structures and quinoline structures, which may be substituted or unsubstituted structures.

Specific examples of the structural unit L are shown below. However, the structural unit L is not limited to the following structures.

[Chemical formula 6]
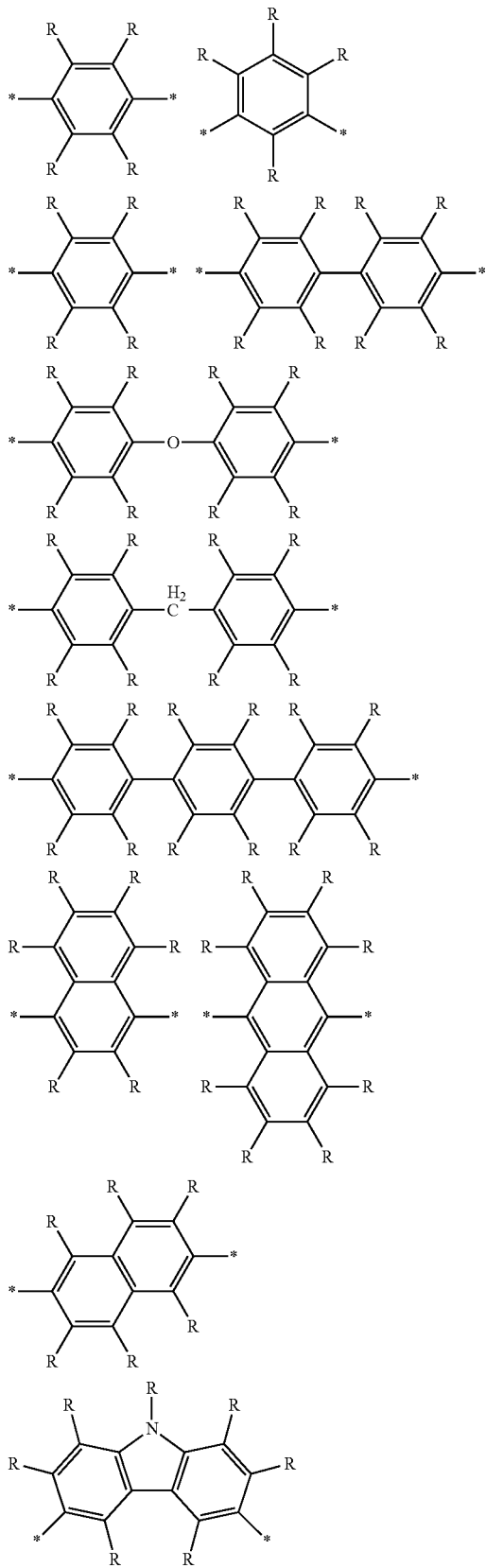
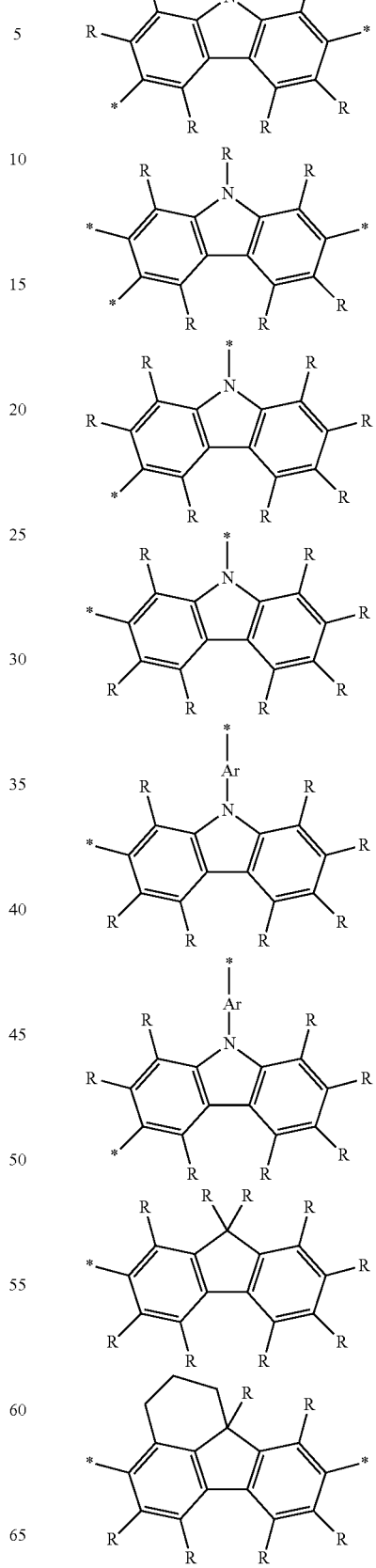

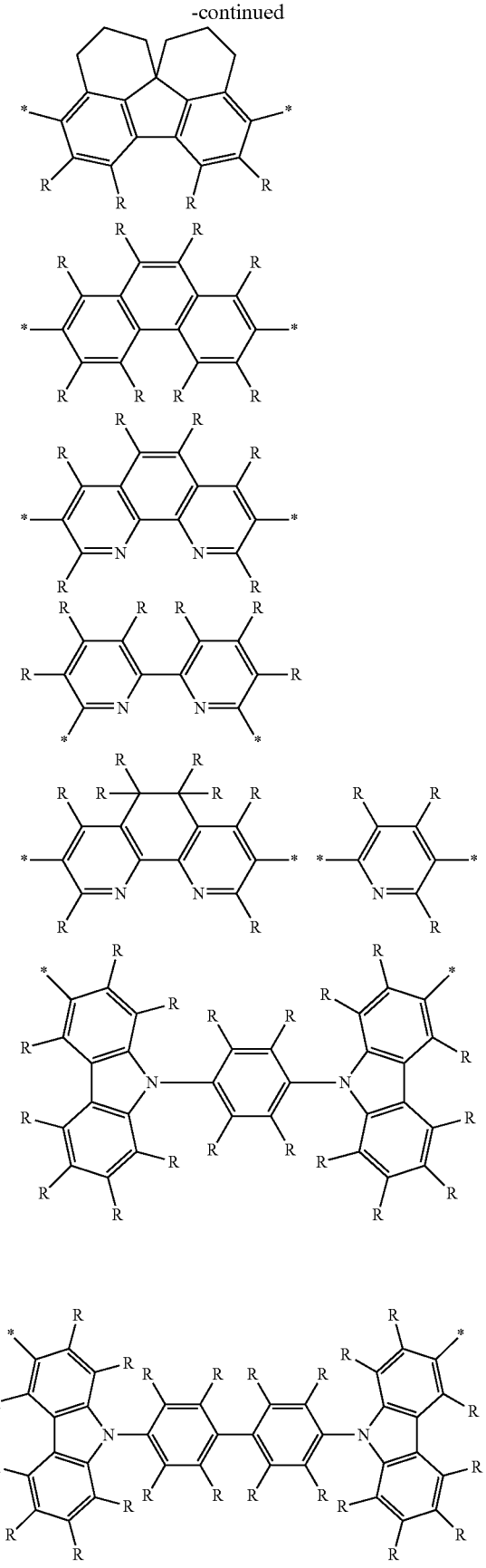
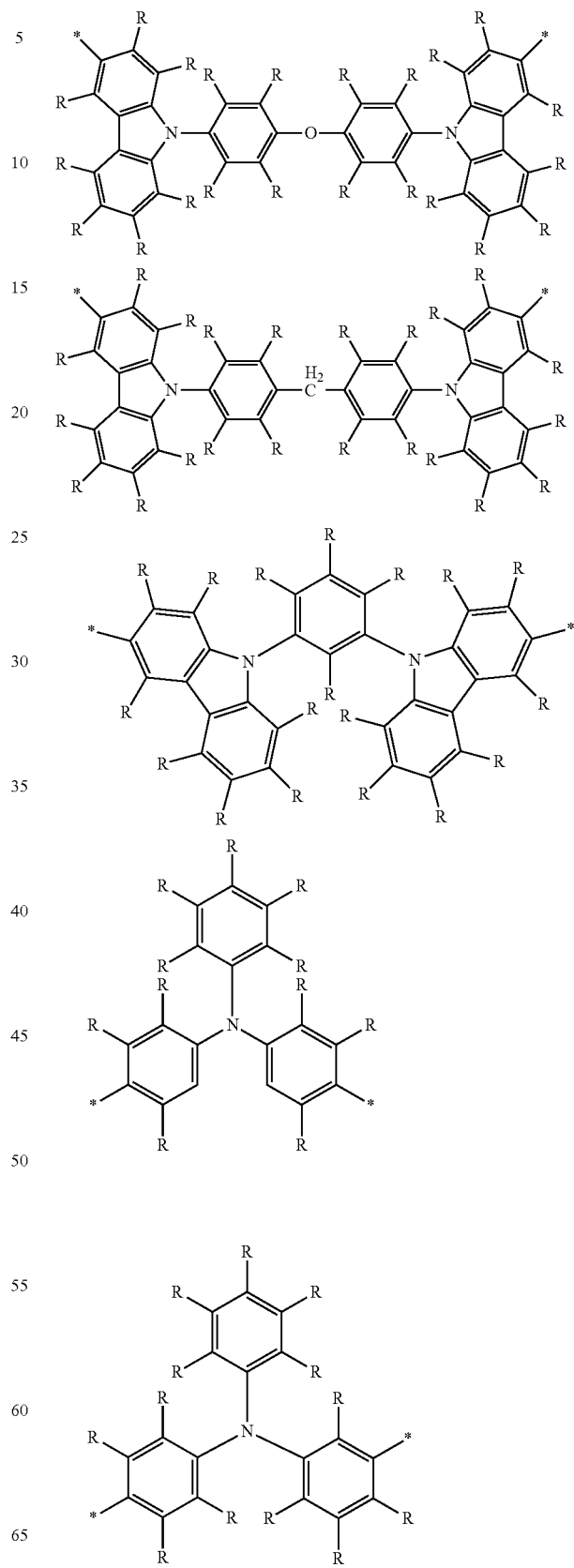

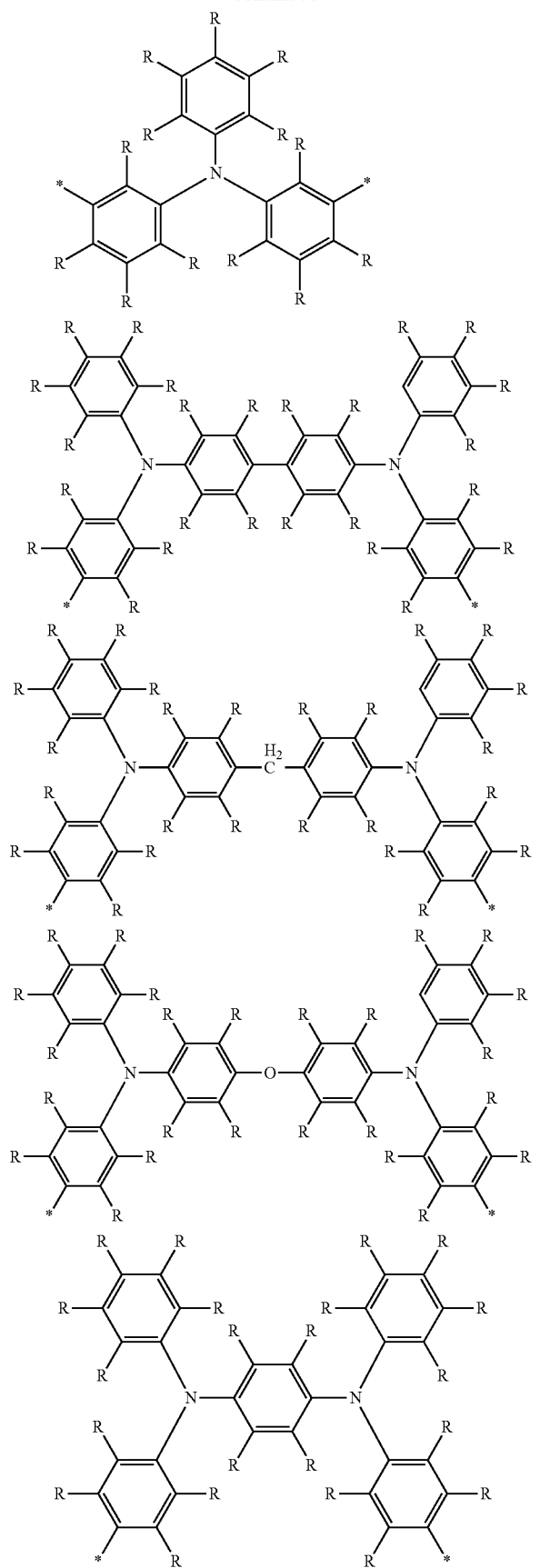

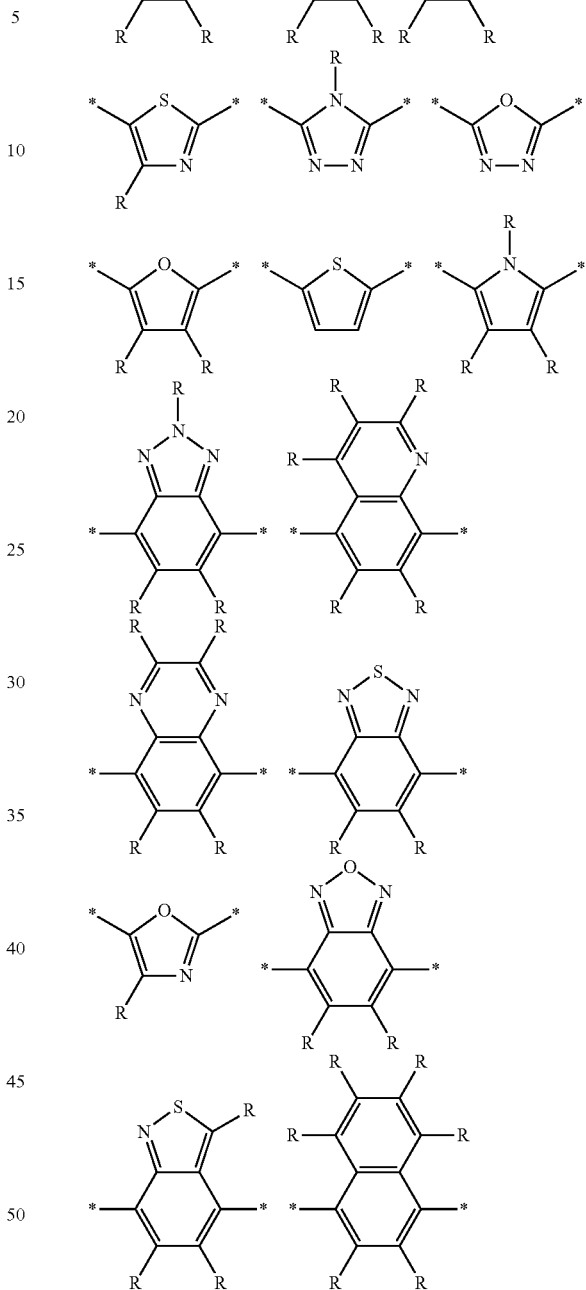

Each R independently represents a hydrogen atom or a substituent. It is preferable that each R is independently selected from the group consisting of —$R^1$, —$OR^2$, —$SR^3$, —$OCOR^4$, —$COOR^5$, —$SiR^6R^7R^8$, a halogen atom, and a group containing a polymerizable functional group. Each of $R^1$ to $R^8$ independently represents a hydrogen atom, a linear, cyclic or branched alkyl group of 1 to 22 carbon atoms, or an aryl group or heteroaryl group of 2 to 30 carbon atoms. An aryl group is an atom grouping in which one hydrogen atom has been removed from an aromatic hydrocarbon. A heteroaryl group is an atom grouping in which one hydrogen atom has been removed from an aromatic heterocycle. The alkyl group may be further substituted with an aryl group or heteroaryl group of 2 to 20 carbon atoms, and the aryl group or heteroaryl group may be further substituted with a linear, cyclic or branched alkyl group of 1 to 22 carbon atoms. R is preferably a hydrogen atom, an alkyl group, an aryl group, or an alkyl-substituted aryl group. Ar represents an arylene group or heteroarylene group of 2 to 30 carbon atoms. An arylene group is an atom grouping in which two hydrogen atoms have been removed from an aromatic hydrocarbon. A heteroarylene group is an atom grouping in which two hydrogen atoms have been removed from an aromatic heterocycle. Ar is preferably an arylene group, and is more preferably a phenylene group.

Examples of the aromatic hydrocarbon include monocyclic hydrocarbons, condensed ring hydrocarbons, and polycyclic hydrocarbons in which two or more hydrocarbons selected from among monocyclic hydrocarbons and condensed ring hydrocarbons are bonded together via single bonds. Examples of the aromatic heterocycles include monocyclic heterocycles, condensed ring heterocycles, and polycyclic heterocycles in which two or more heterocycles selected from among monocyclic heterocycles and condensed ring heterocycles are bonded together via single bonds.

(Structural Unit T)

The structural unit T is a monovalent structural unit that forms a terminal portion of the charge transport polymer. There are no particular limitations on the structural unit T, which may be selected from among substituted or unsubstituted aromatic hydrocarbon structures, substituted or unsubstituted aromatic heterocyclic structures, and structures containing one type, or two or more types, of these structures. The structural unit T may have the same structure to the structural unit L. In this case, an example presented above as the structural unit L may be converted to a monovalent form to form a structural unit T. In one embodiment, from the viewpoint of imparting durability without impairing the charge transport properties, the structural unit T is preferably a substituted or unsubstituted aromatic hydrocarbon structure, and is more preferably a substituted or unsubstituted benzene structure. In those cases where the charge transport polymer has, at a terminal, an aromatic ring having two polymerizable functional groups, the structural unit T includes at least an aromatic hydrocarbon structure having two polymerizable functional groups and/or an aromatic heterocyclic structure having two polymerizable functional groups.

Specific examples of the structural unit T include the units shown below. However, the structural unit T is not limited to the following structural units.

[Chemical formula 8]

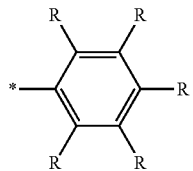

R is the same as R in the structural unit L. In one embodiment, when the charge transport polymer has an aromatic ring having two polymerizable functional groups at a polymer terminal, it is preferable that any two of the R groups are groups containing a polymerizable functional group.

In those cases where the charge transport polymer has, at a terminal, an aromatic ring having two polymerizable functional groups, specific examples of the structural unit T include the structures described above as examples of aromatic rings having two polymerizable functional groups.

(Structural Unit B)

The structural unit B is a trivalent or higher structural unit that forms a branched portion in those cases where the charge transport polymer has a branched structure. From the viewpoint of improving the durability of organic electronic elements, the structural unit B is preferably not higher than hexavalent, and is more preferably either trivalent or tetravalent. The structural unit B is preferably a unit that has charge transport properties. The structural unit B may have the same structure as the structural unit L. In this case, an example presented above as the structural unit L may be converted to a trivalent or higher form to form a structural unit B. For example, from the viewpoint of improving the durability of organic electronic elements, the structural unit B is selected from among substituted or unsubstituted aromatic amine structures, substituted or unsubstituted carbazole structures, substituted or unsubstituted condensed polycyclic aromatic hydrocarbon structures, and structures containing one type, or two or more types, of these structures.

Specific examples of the structural unit B are shown below. However, the structural unit B is not limited to the following structures.

[Chemical formula 9]

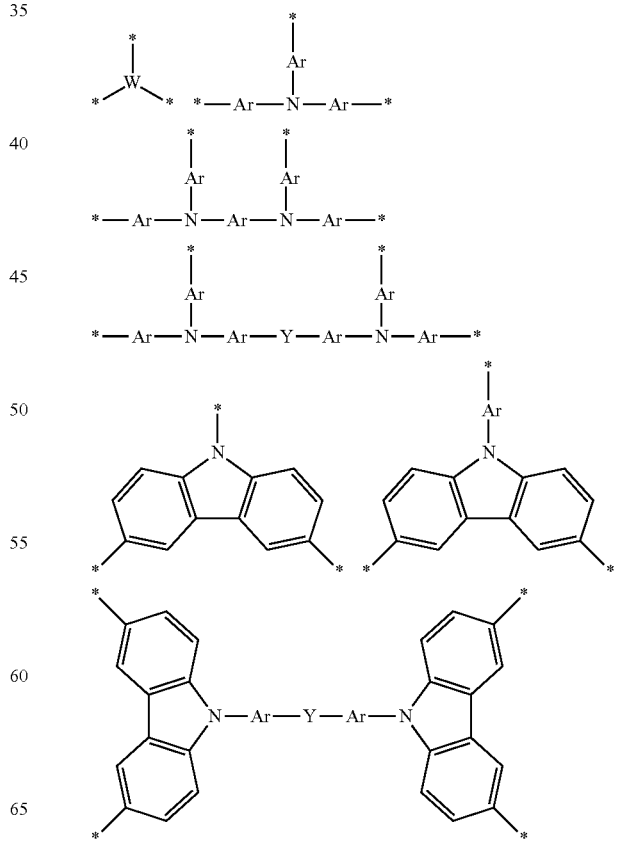

-continued

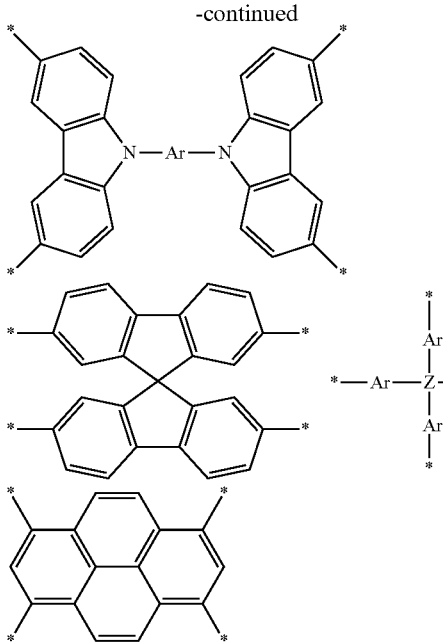

W represents a trivalent linking group, and for example, represents an arenetriyl group or heteroarenetriyl group of 2 to 30 carbon atoms. An arenetriyl group is an atom grouping in which three hydrogen atoms have been removed from an aromatic hydrocarbon. A heteroarenetriyl is an atom grouping in which three hydrogen atoms have been removed from an aromatic heterocycle. Each Ar independently represents a divalent linking group, and for example, may independently represent an arylene group or heteroarylene group of 2 to 30 carbon atoms. Ar is preferably an arylene group, and is more preferably a phenylene group. Y represents a divalent linking group, and examples include divalent groups in which an additional hydrogen atom has been removed from any of the R groups having one or more hydrogen atoms (but excluding a group containing a polymerizable functional group) described in relation to the structural unit L. Z represents a carbon atom, a silicon atom or a phosphorus atom. In the structural units, the benzene rings and Ar groups may have a substituent, and examples of the substituent include the R groups in the structural unit L.

(Number Average Molecular Weight)

The number average molecular weight of the charge transport polymer can be adjusted appropriately with due consideration of the solubility in solvents and the film formability and the like. From the viewpoint of ensuring superior charge transport properties, the number average molecular weight is preferably at least 500, more preferably at least 1,000, and even more preferably 2,000 or greater. Further, from the viewpoints of maintaining favorable solubility in solvents and facilitating the preparation of ink compositions, the number average molecular weight is preferably not more than 1,000,000, more preferably not more than 100,000, and even more preferably 50,000 or less.

(Weight Average Molecular Weight)

The weight average molecular weight of the charge transport polymer can be adjusted appropriately with due consideration of the solubility in solvents and the film formability and the like. From the viewpoint of ensuring superior charge transport properties, the weight average molecular weight is preferably at least 1,000, more preferably at least 5,000, and even more preferably 10,000 or greater. Further, from the viewpoints of maintaining favorable solubility in solvents and facilitating the preparation of ink compositions, the weight average molecular weight is preferably not more than 1,000,000, more preferably not more than 700,000, and even more preferably 400,000 or less.

The number average molecular weight and the weight average molecular weight can be measured by gel permeation chromatography (GPC) using a calibration curve of standard polystyrenes.

For example, the following conditions may be employed for the measurements.

Feed pump: L-6050, manufactured by Hitachi High-Technologies Corporation

UV-Vis detector: L-3000, manufactured by Hitachi High-Technologies Corporation

Columns: Gelpack (a registered trademark) GL-A160S/GL-A150S, manufactured by Hitachi Chemical Co., Ltd.

Eluent: THF (for HPLC, stabilizer-free), manufactured by Wako Pure Chemical Industries, Ltd.

Flow rate: 1 mL/min

Column temperature: room temperature

Molecular weight standards: standard polystyrenes (Proportions of Structural Units)

In those cases where the charge transport polymer includes a structural unit L, from the viewpoint of obtaining satisfactory charge transport properties, the proportion of the structural unit L, based on the total of all the structural units, is preferably at least 10 mol %, more preferably at least 20 mol %, and even more preferably 30 mol % or higher. If the structural unit T and the optionally introduced structural unit B are taken into consideration, then the proportion of the structural unit L is preferably not more than 95 mol %, more preferably not more than 90 mol %, and even more preferably 85 mol % or less.

From the viewpoint of improving the characteristics of organic electronic elements, or from the viewpoint of suppressing any increase in viscosity and enabling more favorable synthesis of the charge transport polymer, the proportion of the structural unit T contained in the charge transport polymer, based on the total of all the structural units, is preferably at least 5 mol %, more preferably at least 10 mol %, and even more preferably 15 mol % or higher. Further, from the viewpoint of obtaining satisfactory charge transport properties, the proportion of the structural unit T is preferably not more than 60 mol %, more preferably not more than 55 mol %, and even more preferably 50 mol % or less.

In those cases where the charge transport polymer includes a structural unit B, from the viewpoint of improving the durability of organic electronic elements, the proportion of the structural unit B, based on the total of all the structural units, is preferably at least 1 mol %, more preferably at least 5 mol %, and even more preferably 10 mol % or higher. Further, from the viewpoints of suppressing any increase in viscosity and enabling more favorable synthesis of the charge transport polymer, or from the viewpoint of obtaining satisfactory charge transport properties, the proportion of the structural unit B is preferably not more than 50 mol %, more preferably not more than 40 mol %, and even more preferably 30 mol % or less.

In those cases where the charge transport polymer has a polymerizable functional group, from the viewpoint of ensuring efficient curing of the charge transport polymer, the proportion of the polymerizable functional group, based on the total of all the structural units, is preferably at least 0.1 mol %, more preferably at least 1 mol %, and even more preferably 3 mol % or higher. Further, from the viewpoint of obtaining favorable charge transport properties, the proportion of the polymerizable functional group is preferably not more than 70 mol %, more preferably not more than 60 mol %, and even more preferably 50 mol % or less. Here, the "proportion of the polymerizable functional group" refers to the proportion of structural units having the polymerizable functional group.

Considering the balance between the charge transport properties, the durability, and the productivity and the like, in those cases where the charge transport polymer contains a structural unit L and a structural unit T, the ratio (molar ratio) between the structural unit L and the structural unit T is preferably L:T=100:(1 to 70), more preferably 100:(3 to 50), and even more preferably 100:(5 to 30). Further, in those cases where the charge transport polymer also includes a structural unit B, the ratio (molar ratio) between the structural unit L, the structural unit T and the structural unit B is preferably L:T:B=100:(10 to 200):(10 to 100), more preferably 100:(20 to 180):(20 to 90), and even more preferably 100:(40 to 160):(30 to 80).

The proportion of each structural unit can be determined from the amount added of the monomer corresponding with that structural unit during synthesis of the charge transport polymer. Further, the proportion of each structural unit can also be calculated as an average value using the integral of the spectrum attributable to the structural unit in the $^1$H NMR spectrum of the charge transport polymer. In terms of simplicity, if the amount added of the monomer is clear, then the value determined using the amount added of the monomer is preferably employed.

When the charge transport polymer is a hole transport material, from the viewpoint of achieving superior hole injection properties and hole transport properties, a compound having a unit having an aromatic amine structure and/or a unit having a carbazole structure as a main structural unit is preferred. From this viewpoint, the proportion of the total number of a unit having an aromatic amine structure and a unit having a carbazole structure (the total number of one type of unit in the case of only one type of unit, or the total number of both types of units in the case of two types of units) relative to the total number of all the structural units within the charge transport polymer (excluding a terminal structural unit) is preferably at least 40%, more preferably at least 45%, and even more preferably 50% or greater. This proportion of the total number of a unit having an aromatic amine structure and/or a unit having a carbazole structure may be 100%.

(Production Method)

The charge transport polymer can be produced by various synthesis methods, and there are no particular limitations. For example, conventional coupling reactions such as the Suzuki coupling, Negishi coupling, Sonogashira coupling, Stille coupling and Buchwald-Hartwig coupling reactions can be used. The Suzuki coupling is a reaction in which a cross-coupling reaction is initiated between an aromatic boronic acid derivative and an aromatic halide using a Pd catalyst. By using a Suzuki coupling, the charge transport polymer can be produced easily by bonding together the desired aromatic rings.

In the coupling reaction, a Pd(0) compound, Pd(II) compound, or Ni compound or the like is used as a catalyst. Further, a catalyst species generated by mixing a precursor such as tris(dibenzylideneacetone)dipalladium(0) or palladium(II) acetate with a phosphine ligand can also be used. Reference may also be made to WO 2010/140553 in relation to synthesis methods for the charge transport polymer.

[Dopant]

The organic electronic material may also contain a dopant. There are no particular limitations on the dopant, provided it is a compound that yields a doping effect upon addition to the organic electronic material, enabling an improvement in the charge transport properties. Doping includes both p-type doping and n-type doping. In p-type doping, a substance that functions as an electron acceptor is used as the dopant, whereas in n-type doping, a substance that functions as an electron donor is used as the dopant. To improve the hole transport properties, p-type doping is preferably used, whereas to improve the electron transport properties, n-type doping is preferably used. The dopant used in the organic electronic material may be a dopant that exhibits either a p-type doping effect or an n-type doping effect. Further, a single type of dopant may be added alone, or a mixture of a plurality of dopant types may be added.

The dopants used in p-type doping are electron-accepting compounds, and examples include Lewis acids, protonic acids, transition metal compounds, ionic compounds, halogen compounds and π-conjugated compounds. Specific examples include Lewis acids such as $FeCl_3$, $PF_5$, $AsF_5$, $SbF_5$, $BF_5$, $BCl_3$ and $BBr_3$; protonic acids, including inorganic acids such as HF, HCl, HBr, $HNO_3$, $H_2SO_4$ and $HClO_4$, and organic acids such as benzenesulfonic acid, p-toluenesulfonic acid, dodecylbenzenesulfonic acid, polyvinylsulfonic acid, methanesulfonic acid, trifluoromethanesulfonic acid, trifluoroacetic acid, 1-butanesulfonic acid, vinylphenylsulfonic acid and camphorsulfonic acid; transition metal compounds such as FeOCl, $TiCl_4$, $ZrCl_4$, $HfCl_4$, $NbF_5$, $AlCl_3$, $NbCl_5$, $TaCl_5$ and $MoF_5$; ionic compounds, including salts containing a perfluoro anion such as a tetrakis(pentafluorophenyl)borate ion, tris(trifluoromethanesulfonyl)methide ion, bis(trifluoromethanesulfonyl)imide ion, hexafluoroantimonate ion, $AsF_6^-$ (hexafluoroarsenate ion), $BF_4^-$ (tetrafluoroborate ion) or $PF_6^-$ (hexafluorophosphate ion), and salts having a conjugate base of an aforementioned protonic acid as an anion; halogen compounds such as $Cl_2$, $Br_2$, $I_2$, ICl, $ICl_3$, IBr and IF; and π-conjugated compounds such as TCNE (tetracyanoethylene) and TCNQ (tetracyanoquinodimethane). Further, the electron-accepting compounds disclosed in JP 2000-36390 A, JP 2005-75948 A, and JP 2003-213002 A and the like can also be used. Lewis acids, ionic compounds, and π-conjugated compounds and the like are preferred. Among these, onium salts are particularly desirable.

Onium salts are compounds that include an onium ion. Examples of onium salts include salts containing onium ions such as ammonium, phosphonium, oxonium, sulfonium and iodonium ions. For example, an onium salt may be selected and used from among the examples of ionic compounds.

The dopants used in n-type doping are electron-donating compounds, and examples include alkali metals such as Li and Cs; alkaline earth metals such as Mg and Ca; salts of alkali metals and/or alkaline earth metals such as LiF and $Cs_2CO_3$; metal complexes; and electron-donating organic compounds.

In order to make it easier to change the degree of solubility of the organic layer, the use of a compound that can function as a polymerization initiator for the polymerizable functional group as the dopant is preferred. Examples of materials that combine a function as a dopant and a function as a polymerization initiator include onium salts.

[Polymerization Initiator]

In those cases where the charge transport polymer has a polymerizable functional group, the organic electronic material preferably contains a polymerization initiator. Conventional radical polymerization initiators, cationic polymerization initiators, and anionic polymerization initiators and the like can be used as the polymerization initiator. From the viewpoint of enabling simple preparation of the ink composition, the use of a substance that exhibits both a function as a dopant and a function as a polymerization initiator is preferred. Examples of polymerization initiators that also function as a dopant include onium salts. Examples of these onium salts include salts having an anion having a perfluoroaryl group or perfluoroalkyl group, and specific examples include salts of an anion having a perfluoroaryl group and an iodonium ion or ammonium ion. Examples of these salts are shown below.

[Chemical formula 10]

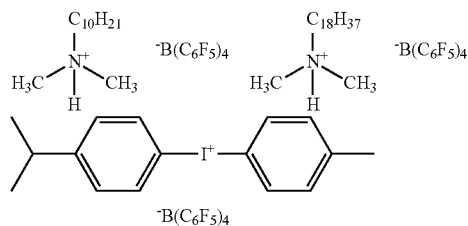

[Other Optional Components]

The organic electronic material may also include other charge transport polymers, or charge transport low-molecular weight compounds or the like.

[Contents]

From the viewpoint of obtaining favorable charge transport properties, the amount of the charge transport polymer, relative to the total mass of the organic electronic material, is preferably at least 50% by mass, more preferably at least 70% by mass, and even more preferably 80% by mass or greater. The amount may be 100% by mass.

When a dopant is included, from the viewpoint of improving the charge transport properties of the organic electronic material, the amount of the dopant relative to the total mass of the organic electronic material is preferably at least 0.01% by mass, more preferably at least 0.1% by mass, and even more preferably 0.5% by mass or greater. Further, from the viewpoint of maintaining favorable film formability, the amount of the dopant relative to the total mass of the organic electronic material is preferably not more than 50% by mass, more preferably not more than 30% by mass, and even more preferably 20% by mass or less.

In those cases where a polymerization initiator is included, from the viewpoint of improving the curability of the charge transport polymer, the amount of the polymerization initiator, relative to the total mass of the organic electronic material, is preferably at least 0.01% by mass, more preferably at least 0.1% by mass, and even more preferably 0.5% by mass or greater. Further, from the viewpoint of maintaining favorable charge transport properties, the amount of the polymerization initiator relative to the total mass of the organic electronic material is preferably not more than 50% by mass, more preferably not more than 30% by mass, and even more preferably 20% by mass or less.

<Ink Composition>

The organic electronic material is preferably used in the form of an ink composition containing the organic electronic material of the embodiment described above and a solvent capable of dissolving or dispersing the material. By using such an ink composition, an organic layer can be formed easily using a simple coating method.

[Solvent]

Water, organic solvents, or mixed solvents thereof can be used as the solvent. Examples of the organic solvent include alcohols such as methanol, ethanol and isopropyl alcohol; alkanes such as pentane, hexane and octane; cyclic alkanes such as cyclohexane; aromatic hydrocarbons such as benzene, toluene, xylene, mesitylene, tetralin and diphenylmethane; aliphatic ethers such as ethylene glycol dimethyl ether, ethylene glycol diethyl ether and propylene glycol-1-monomethyl ether acetate; aromatic ethers such as 1,2-dimethoxybenzene, 1,3-dimethoxybenzene, anisole, phenetole, 2-methoxytoluene, 3-methoxytoluene, 4-methoxytoluene, 2,3-dimethylanisole and 2,4-dimethylanisole; aliphatic esters such as ethyl acetate, n-butyl acetate, ethyl lactate and n-butyl lactate; aromatic esters such as phenyl acetate, phenyl propionate, methyl benzoate, ethyl benzoate, propyl benzoate and n-butyl benzoate; amide-based solvents such as N,N-dimethylformamide and N,N-dimethylacetamide; as well as dimethyl sulfoxide, tetrahydrofuran, acetone, chloroform and methylene chloride and the like. Preferred solvents include aromatic hydrocarbons, aliphatic esters, aromatic esters, aliphatic ethers, and aromatic ethers and the like, and aromatic hydrocarbons are particularly preferred.

[Additives]

The ink composition may also contain additives as optional components. Examples of these additives include polymerization inhibitors, stabilizers, thickeners, gelling agents, flame retardants, antioxidants, reduction inhibitors, oxidizing agents, reducing agents, surface modifiers, emulsifiers, antifoaming agents, dispersants and surfactants.

[Contents]

The amount of the solvent in the ink composition can be determined with due consideration of the use of the composition in various application methods. For example, the amount of the solvent is preferably an amount that yields a ratio of the charge transport polymer relative to the solvent that is at least 0.1% by mass, more preferably at least 0.2% by mass, and even more preferably 0.5% by mass or greater. Further, the amount of the solvent is preferably an amount that yields a ratio of the charge transport polymer relative to the solvent that is not more than 20% by mass, more preferably not more than 15% by mass, and even more preferably 10% by mass or less.

<Organic Layer>

According to one embodiment, an organic layer is formed using the organic electronic material or the ink composition of the embodiments described above. By using the ink composition, the organic layer can be formed favorably by a coating method. Examples of the coating method include conventional methods such as spin coating methods; casting methods; dipping methods; plate-based printing methods such as relief printing, intaglio printing, offset printing, lithographic printing, relief reversal offset printing, screen printing and gravure printing; and plateless printing methods such as inkjet methods. When the organic layer is formed by a coating method, the organic layer (coating layer) obtained following coating may be dried using a hot plate or an oven to remove the solvent.

In those cases where the charge transport polymer has a polymerizable functional group, the degree of solubility of the organic layer may be changed by using light irradiation or a heat treatment or the like to cause a polymerization reaction of the charge transport polymer. By stacking organic layers having changed degrees of solubility, multilayering of an organic electronic element can be performed with ease. Reference may also be made to WO 2010/140553 in relation to the method used for forming the organic layer.

From the viewpoint of improving the efficiency of charge transport, the thickness of the organic layer following drying or curing is preferably at least 0.1 nm, more preferably at least 1 nm, and even more preferably 3 nm or greater. Further, from the viewpoint of reducing the electrical resistance, the thickness of the organic layer is preferably not more than 300 nm, more preferably not more than 200 nm, and even more preferably 100 nm or less.

<Organic Electronic Element>

According to one embodiment, an organic electronic element has at least the organic layer of the embodiment described above. Examples of the organic electronic element include an organic EL element, an organic photoelectric conversion element, and an organic transistor. The organic electronic element preferably has at least a structure in which the organic layer is disposed between a pair of electrodes.

<Organic EL Element>

According to one embodiment, an organic EL element has at least the organic layer of the embodiment described above. The organic EL element typically includes a light-emitting layer, an anode, a cathode and a substrate, and if necessary, may also have other functional layers such as a hole injection layer, electron injection layer, hole transport layer and electron transport layer. Each layer may be formed by a vapor deposition method, or by a coating method. The organic EL element preferably has the organic layer as the light-emitting layer or as a functional layer, more preferably has the organic layer as a functional layer, and even more preferably has the organic layer as at least one of a hole injection layer and a hole transport layer.

FIG. 1 is a cross-sectional schematic view illustrating one embodiment of the organic EL element. The organic EL element in FIG. 1 is an element with a multilayer structure, and has a substrate 8, an anode 2, a hole injection layer 3 formed from the organic layer of the embodiment described above, a hole transport layer 6, a light-emitting layer 1, an electron transport layer 7, an electron injection layer 5 and a cathode 4 provided in that order. Each of these layers is described below.

In FIG. 1, the hole injection layer 3 is an organic layer of the embodiment described above, but the organic EL element of this embodiment is not limited to this type of structure, and another layer may be an organic layer of the above embodiment.

[Light-Emitting Layer]

Examples of the materials that can be used for the light-emitting layer include low-molecular weight compounds, polymers, and dendrimers and the like. Polymers exhibit good solubility in solvents, meaning they are suitable for coating methods, and are consequently preferred. Examples of the light-emitting material include fluorescent materials, phosphorescent materials, and thermally activated delayed fluorescent materials (TADF).

Specific examples of the fluorescent materials include low-molecular weight compounds such as perylene, coumarin, rubrene, quinacridone, stilbene, color laser dyes, aluminum complexes, and derivatives of these compounds; polymers such as polyfluorene, polyphenylene, polyphenylenevinylene, polyvinylcarbazole, fluorene-benzothiadiazole copolymers, fluorene-triphenylamine copolymers, and derivatives of these compounds; and mixtures of the above materials.

Examples of materials that can be used as the phosphorescent materials include metal complexes and the like containing a metal such as Ir or Pt or the like. Specific examples of Ir complexes include FIr(pic) (iridium(III) bis[(4,6-difluorophenyl)-pyridinato-N,$C^2$]picolinate) which emits blue light, Ir(ppy)$_3$ (fac-tris(2-phenylpyridine)iridium) which emits green light, and (btp)$_2$Ir(acac) (bis[2-(2'-benzo[4,5-α]thienyl)pyridinato-N,$C^3$]iridium(acetyl-acetonate)) and Ir(piq)$_3$ (tris(1-phenylisoquinoline)iridium) which emit red light. Specific examples of Pt complexes include PtOEP (2,3,7,8,12,13,17,18-octaethyl-21H,23H-porphyrin-platinum) which emits red light.

When the light-emitting layer contains a phosphorescent material, a host material is preferably also included in addition to the phosphorescent material. Low-molecular weight compounds, polymers, and dendrimers can be used as this host material. Examples of the low-molecular weight compounds include CBP (4,4'-bis(9H-carbazol-9-yl)-biphenyl), mCP (1,3-bis(9-carbazolyl)benzene), CDBP (4,4'-bis(carbazol-9-yl)-2,2'-dimethylbiphenyl), and derivatives of these compounds, whereas examples of the polymers include the organic electronic material of the embodiment described above, polyvinylcarbazole, polyphenylene, polyfluorene, and derivatives of these polymers.

Examples of the thermally activated delayed fluorescent materials include the compounds disclosed in Adv. Mater., 21, 4802-4806 (2009); Appl. Phys. Lett., 98, 083302 (2011); Chem. Comm., 48, 9580 (2012); Appl. Phys. Lett., 101, 093306 (2012); J. Am. Chem. Soc., 134, 14706 (2012); Chem. Comm., 48, 11392 (2012); Nature, 492, 234 (2012); Adv. Mater., 25, 3319 (2013); J. Phys. Chem. A, 117, 5607 (2013); Phys. Chem. Chem. Phys., 15, 15850 (2013); Chem. Comm., 49, 10385 (2013); and Chem. Lett., 43, 319 (2014) and the like.

[Hole Transport Layer, Hole Injection Layer]

Examples of the material used in the hole transport layer and the hole injection layer include the organic electronic material of the embodiment described above. Further, in those cases where, for example, the organic EL element has a layer formed using the organic electronic material of the embodiment described above as a hole injection layer, and also has a hole transport layer, a conventional material may be used for the hole transport layer. Further, in those cases where, for example, the organic EL element has an organic layer formed using the organic electronic material of the embodiment described above as a hole transport layer, and also has a hole injection layer, a conventional material may be used for the hole injection layer.

Examples of materials that can be used for the hole injection layer and the hole transport layer include aromatic amine-based compounds (for example, aromatic diamines such as N,N'-di(naphthalen-1-yl)-N,N'-diphenyl-benzidine (α-NPD)), phthalocyanine-based compounds, and thiophene-based compounds (for example, thiophene-based conductive polymers such as poly(3,4-ethylenedioxythiophene):poly(4-styrenesulfonate) (PEDOT:PSS)) and the like.

[Electron Transport Layer, Electron Injection Layer]

Examples of materials that can be used for the electron transport layer and the electron injection layer include phenanthroline derivatives, bipyridine derivatives, nitro-substituted fluorene derivatives, diphenylquinone derivatives, thiopyran dioxide derivatives, condensed-ring tetracarboxylic acid anhydrides of naphthalene and perylene and the like, carbodiimides, fluorenylidenemethane derivatives, anthraquinodimethane and anthrone derivatives, oxadiazole derivatives, thiadiazole derivatives, benzimidazole derivatives (for example, 2,2',2"-(1,3,5-benzenetriyl)tris(1-phenyl-1H-benzimidazole) (TPBi)), quinoxaline derivatives, and aluminum complexes (for example, aluminum bis(2-methyl-8-quinolinolate)-4-(phenylphenolate) (BAlq)). Further, the organic electronic material of the embodiment described above may also be used.

[Cathode]

Examples of the cathode material include metals or metal alloys, such as Li, Ca, Mg, Al, In, Cs, Ba, Mg/Ag, LiF and CsF.

[Anode]

Metals (for example, Au) or other materials having conductivity can be used as the anode. Examples of the other materials include oxides (for example, ITO: indium oxide/tin oxide), and conductive polymers (for example, polythiophene-polystyrene sulfonate mixtures (PEDOT:PSS)).

[Substrate]

Glass and plastics and the like can be used as the substrate. The substrate is preferably transparent, and a substrate having flexibility is preferred. Quartz glass and light-transmitting resin films and the like can be used particularly favorably.

Examples of the resin films include films containing polyethylene terephthalate, polyethylene naphthalate, polyethersulfone, polyetherimide, polyetheretherketone, polyphenylene sulfide, polyarylate, polyimide, polycarbonate, cellulose triacetate or cellulose acetate propionate.

In those cases where a resin film is used, an inorganic substance such as silicon oxide or silicon nitride may be coated onto the resin film to inhibit the transmission of water vapor and oxygen and the like.

[Emission Color]

There are no particular limitations on the color of the light emission from the organic EL element. White organic EL elements can be used for various illumination fixtures, including domestic lighting, in-vehicle lighting, watches and liquid crystal backlights, and are consequently preferred.

The method used for forming a white organic EL element may employ a method in which a plurality of light-emitting materials are used to emit a plurality of colors simultaneously, which are then mixed to obtain a white light emission. There are no particular limitations on the combination of the plurality of emission colors, and examples include combinations that include three maximum emission wavelengths for blue, green and red, and combinations that include two maximum emission wavelengths for blue and yellow, or for yellowish green and orange or the like. Control of the emission color can be achieved by appropriate adjustment of the types and amounts of the light-emitting materials.

<Display Element, Illumination Device, Display Device>

According to one embodiment, a display element contains the organic EL element of the embodiment described above. For example, by using the organic EL element as the element corresponding with each color pixel of red, green and blue (RGB), a color display element can be obtained. Examples of the image formation method include a simple matrix in which organic EL elements arrayed in a panel are driven directly by an electrode arranged in a matrix, and an active matrix in which a thin-film transistor is positioned and driven on each element.

Further, according to one embodiment, an illumination device contains the organic EL element of the embodiment described above. Moreover, according to one embodiment, a display device contains the illumination device and a liquid crystal element as a display unit. For example, the display device may be a device that uses the illumination device described above as a backlight, and uses a conventional liquid crystal element as the display unit, namely a liquid crystal display device.

EXAMPLES

The present invention is described below in further detail using a series of examples, but the present invention is not limited by the following examples.

<Synthesis of Monomer C1>

[Chemical formula 11]

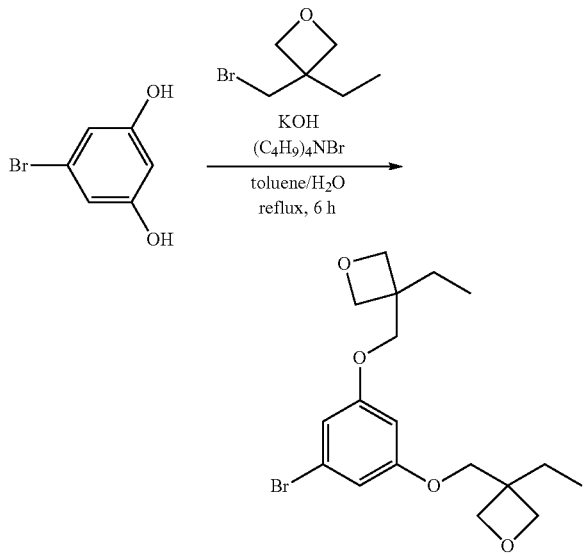

Figure 2:
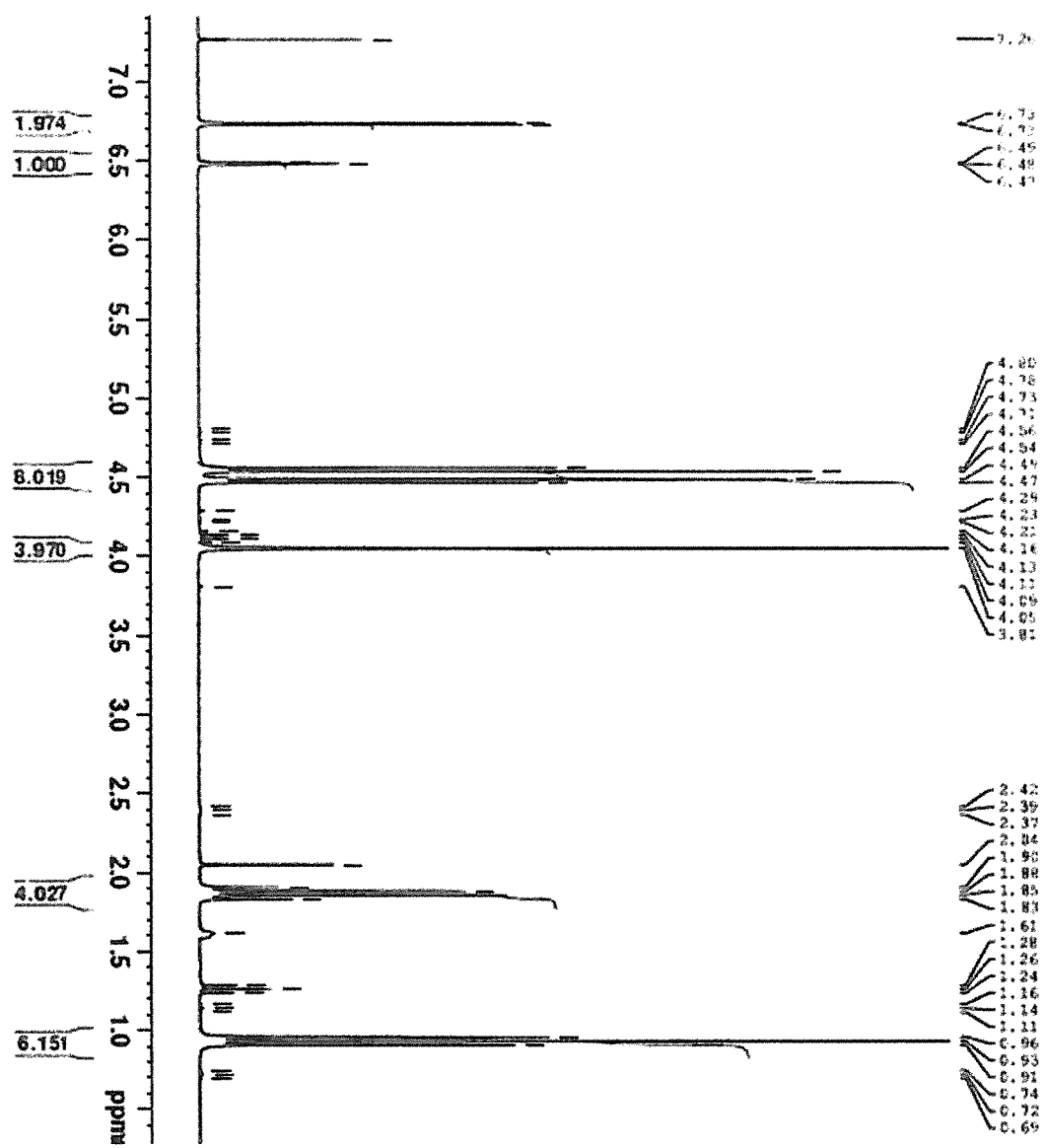
FIG. 2 is a diagram illustrating the $^1$H-NMR (nuclear magnetic resonance) spectrum of a monomer used in the examples.

A round-bottom flask was charged with 5-bromoresorcinol (20 mmol), an oxetane compound (50 mmol), tetrabutylammonium bromide (3 mmol), potassium hydroxide (240 mmol), 13.5 g of water and 30 mL of toluene, and the resulting mixture was heated and refluxed for 6 hours. Subsequently, the reaction mixture was quenched with water, and the target product was extracted with ethyl acetate and dried over anhydrous magnesium sulfate. The solvent was then removed using an evaporator, and the thus obtained crude product was purified by silica gel column chromatography (filler: Wakogel (a registered trademark) C-300HG, manufactured by Wako Pure Chemical Industries, Ltd., mobile phase: n-hexane:ethyl acetate=8:2), yielding 3.8 g of a monomer C1 as a colorless oil. The yield was 50%. The $^1$H-NMR measurement results are shown in FIG. 2 and listed below.

$^1$H-NMR (300 MHz, CDCl$_3$, δ ppm): 0.93 (t, J=7.5 Hz, 6H), 1.85 (q, J=7.5 Hz, 4H), 4.05 (s, 4H), 4.48 (d, J=5.7 Hz, 4H), 4.45 (d, J=5.7 Hz, 4H), 6.48 (s, 1H), 6.73 (s, 2H).

<Preparation of Pd Catalyst>

In a glove box under a nitrogen atmosphere at room temperature, tris(dibenzylideneacetone)dipalladium (73.2 mg, 80 µmol) was weighed into a sample tube, toluene (15 mL) was added, and the resulting mixture was agitated for 30 minutes. In a similar manner, tris(t-butyl)phosphine (129.6 mg, 640 µmol) was weighed into a sample tube, toluene (5 mL) was added, and the resulting mixture was agitated for 5 minutes. These two solutions were then mixed together and stirred for 30 minutes at room temperature to obtain a Pd catalyst solution. All the solvents were deaerated by nitrogen bubbling for at least 30 minutes prior to use.

<Synthesis of Charge Transport Polymer 1>

A three-neck round-bottom flask was charged with a monomer A1 (5.0 mmol), a monomer B1 (2.0 mmol), a monomer C1 (4.0 mmol), methyl tri-n-octyl ammonium chloride ("Aliquat 336" manufactured by Alfa Aesar Ltd.) (0.03 g), potassium hydroxide (1.12 g), pure water (5.54 mL) and toluene (50 mL), and the prepared Pd catalyst solution (3.0 mL) was then added. All of the solvents were deaerated by nitrogen bubbling for at least 30 minutes prior to use. The resulting mixture was heated and refluxed for 2 hours. All the operations up to this point were conducted under a stream of nitrogen.

After completion of the reaction, the organic layer was washed with water and then poured into methanol-water (9:1). The resulting precipitate was collected by filtration under reduced pressure, and washed with methanol-water (9:1). The thus obtained precipitate was dissolved in toluene, and re-precipitated from methanol. The obtained precipitate was then collected by filtration under reduced pressure and dissolved in toluene, and a metal adsorbent ("Triphenylphosphine, polymer-bound on styrene-divinylbenzene copolymer", manufactured by Strem Chemicals Inc., 200 mg per 100 mg of the precipitate) was then added to the solution and stirred at 80° C. for 2 hours. Following completion of the stirring, the metal adsorbent and other insoluble matter were removed by filtration, and the filtrate was re-precipitated from methanol. The thus produced precipitate was collected by filtration under reduced pressure, and washed with methanol. The thus obtained precipitate was then dried under vacuum, yielding a charge transport polymer 1. The molecular weight was measured by GPC (relative to polystyrene standards) using tetrahydrofuran (THF) as the eluent. The thus obtained charge transport polymer 1 had a number average molecular weight of 13,600 and a weight average molecular weight of 49,200.

The measurement conditions for the number average molecular weight and the weight average molecular weight were as follows.

Feed pump: L-6050, manufactured by Hitachi High-Technologies Corporation

UV-Vis detector: L-3000, manufactured by Hitachi High-Technologies Corporation

Columns: Gelpack (a registered trademark) GL-A160S/GL-A150S, manufactured by Hitachi Chemical Co., Ltd.

Eluent: THF (for HPLC, stabilizer-free), manufactured by Wako Pure Chemical Industries, Ltd.

Flow rate: 1 mL/min

Column temperature: room temperature

Molecular weight standards: standard polystyrenes

<Synthesis of Charge Transport Polymer 2>

A three-neck round-bottom flask was charged with the monomer A1 (5.0 mmol), the monomer B1 (2.0 mmol), a monomer C2 (4.0 mmol) and toluene (20 mL), and the prepared Pd catalyst solution (7.5 mL) was then added. Thereafter, a charge transport polymer 2 was synthesized in the same manner as the synthesis of the charge transport polymer 1. The thus obtained charge transport polymer 2 had a number average molecular weight of 14,700 and a weight average molecular weight of 46,100.

<Synthesis of Hole Transport Polymer 3>

A three-neck round-bottom flask was charged with the monomer A1 (5.0 mmol), the monomer B1 (2.0 mmol), a monomer C3 (4.0 mmol) and toluene (20 mL), and the prepared Pd catalyst solution (7.5 mL) was then added. Thereafter, a charge transport polymer 3 was synthesized in the same manner as the synthesis of the charge transport polymer 1. The thus obtained charge transport polymer 3 had a number average molecular weight of 15,800 and a weight average molecular weight of 141,100.

The monomers used in the charge transport polymers 1 to 3 are summarized below.

TABLE 1

| Polymer | Monomers used |
| --- | --- |
| Charge transport polymer 1 | Monomer A1, monomer B1, monomer C1 |
| Charge transport polymer 2 | Monomer A1, monomer B1, monomer C2 |
| Charge transport polymer 3 | Monomer A1, monomer B1, monomer C3 |

[Chemical formula 12]

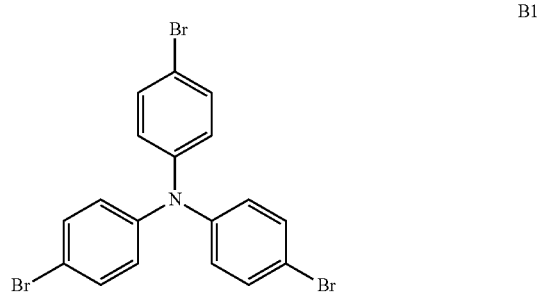

B1

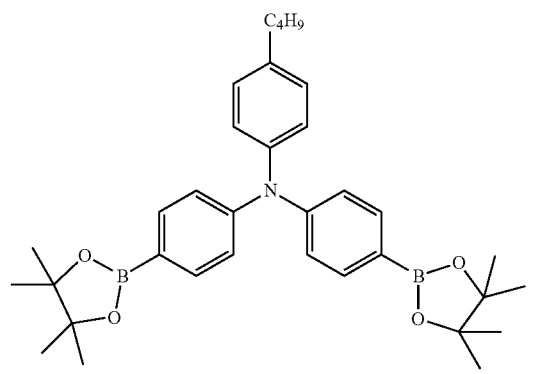

A1

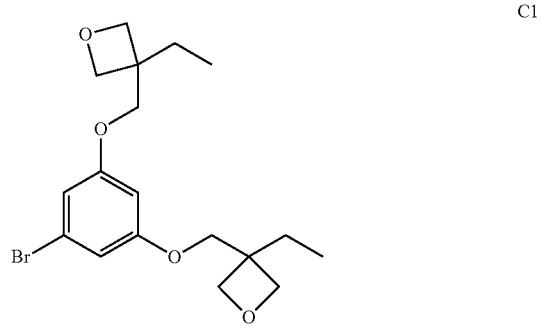

C1

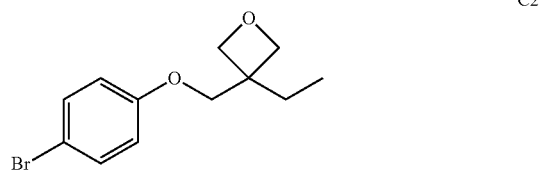

C2

-continued

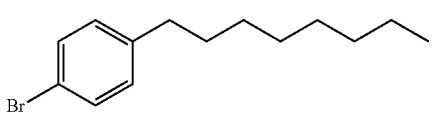

C3

<Amount of Methanol for Charge Transport Polymers 1 and 2>

First, 20 mg of the charge transport polymer was dissolved in 2,290 µL of toluene (good solvent, manufactured by Kanto Chemical Co., Inc., 25° C.) to obtain a polymer solution. Next, 1,000 µL of the polymer solution was measured into a sample tube (manufactured by AS ONE Corporation, 6 mL) containing a stirring bar. Then, 25 µL of methanol (poor solvent, manufactured by Kanto Chemical Co., Inc., 25° C.) was added dropwise to the sample tube at room temperature (25° C.), the sample tube was sealed, and the mixture was stirred using the stirrer (rotational rate: 600 $min^{-1}$). The operations of dropwise addition, tube sealing and stirring were repeated until cloudiness developed in the polymer solution, and the amount of methanol that had been added dropwise by the time cloudiness developed was measured. The cloudiness was confirmed visually.

The amounts of methanol dropwise addition are shown in Table 2.

TABLE 2

| Polymer | Amount of methanol dropwise addition |
|---|---|
| Charge transport polymer 1 | 550 µL |
| Charge transport polymer 2 | 350 µL |

The charge transport polymer 1 is a polymer that exhibits an amount of methanol exceeding 350 µL, whereas the charge transport polymer 2 is a polymer that exhibits an amount of methanol that is 350 µL or less.

<Evaluation of Solubility of Charge Transport Polymers>
[Solubility Evaluation Method]

First, 10 mg samples of the charge transport polymers 1 and 2 were each weighed into a sample tube (manufactured by AS ONE Corporation, 6 mL). Subsequently, a stirring bar and 1,145 µL, of toluene (25° C.) were added to the sample tube, the mixture was observed visually while stirring (at a rotational rate of 600 $min^{-1}$) was performed at a temperature of 25° C., and the amount of time required from the addition of toluene until the polymer mixed liquid became transparent was measured.
[Solubility Evaluation Results]

The dissolution times for the charge transport polymers 1 and 2 are shown in Table 3.

TABLE 3

| | Polymer | Dissolution time |
|---|---|---|
| Example 1 | Charge transport polymer 1 | 3 minutes |
| Comparative Example 1 | Charge transport polymer 2 | 8 minutes |

The dissolution time for the charge transport polymer 1 was less than half of that of the charge transport polymer 2. It was clear that the charge transport polymer 1 that represents an embodiment of the present invention had excellent solubility.

<Evaluation of Change in the Degree of Solubility of Organic Electronic Materials>

Example 2

The charge transport polymer 1 (10.0 mg) was dissolved in toluene (1,991 µL) to obtain a polymer solution. Further, an onium salt shown below (0.309 mg) was dissolved in toluene (309 µL) to obtain an onium salt solution. The thus obtained polymer solution and onium salt solution were then mixed together, thus preparing a coating solution (an ink composition containing an organic electronic material). The coating solution was spin-coated at room temperature (25° C.) onto a quartz glass plate at a rotational rate of 3,000 $min^{-1}$, thus forming an organic thin film. The quartz glass plate was then placed on a hot plate and heated for 10 minutes under one of various temperature conditions. Subsequently, the quartz glass plate was grasped with a pair of tweezers and immersed in a 200 mL beaker filled with toluene (25° C.), and the quartz glass plate was agitated 10 times back and forth in the thickness direction of the quartz glass plate over a period of 10 seconds. The absorbance (Abs) at the absorption maximum (λmax) in the UV-vis spectrum of the organic thin film was measured before and after the immersion, and the residual film ratio of the organic thin film was determined using the formula below.

[Chemical formula 13]

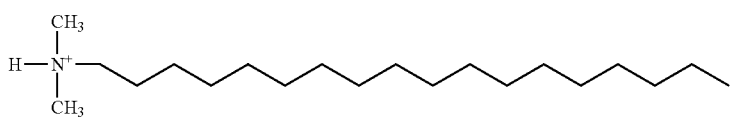 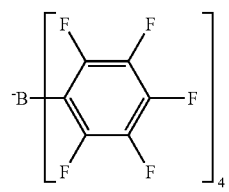

Onium salt

Residual film ratio (%)=Abs of organic thin film after immersion/Abs of organic thin film before immersion×100    [Numerical Formula 1]

Measurement of the absorbance was performed using a spectrophotometer (U-3310, manufactured by Hitachi, Ltd.), by measuring the absorbance of the organic thin film at the maximum absorption wavelength within a wavelength range from 300 to 500 nm.

Comparative Example 2

The charge transport polymer 2 (10.0 mg) was dissolved in toluene (1,991 µL) to obtain a polymer solution. Further, the above onium salt (0.309 mg) was dissolved in toluene (309 µL) to obtain an onium salt solution. The thus obtained polymer solution and onium salt solution were then mixed together, thus preparing a coating solution. The coating solution was spin-coated at room temperature (25° C.) onto a quartz glass plate at a rotational rate of 3,000 min$^{-1}$, thus forming an organic thin film. Thereafter, the residual film ratio of the organic thin film was determined in the same manner as Example 2.

The residual film ratios for the charge transport polymers 1 and 2 are shown in Table 4.

TABLE 4

| | Charge transport polymer | Heating temperature (° C.) | Heating time (min) | Residual film ratio (%) |
|---|---|---|---|---|
| Example 2 | Polymer 1 | 100 | 10 | 55.9 |
| | | 120 | | 83.0 |
| | | 140 | | 96.2 |
| | | 160 | | 99.0 |
| | | 180 | | 98.7 |
| | | 200 | | 98.7 |
| Comparative Example 2 | Polymer 2 | 100 | 10 | 53.8 |
| | | 120 | | 72.2 |
| | | 140 | | 86.7 |
| | | 160 | | 93.0 |
| | | 180 | | 98.3 |
| | | 200 | | 99.8 |

The organic thin film formed using the charge transport polymer 1 exhibited a higher residual film ratio upon heating at a low temperature than the organic thin film formed using the charge transport polymer 2. It was clear that the organic electronic material containing the charge transport polymer 1 was capable of being cured at low temperatures.

<Production of Organic EL Elements>

Example 3

The charge transport polymer 1 (10.0 mg) was dissolved in toluene (2,200 μL) to obtain a polymer solution. Further, the above onium salt (0.1 mg) was dissolved in toluene (100 μL) to obtain an onium salt solution. The thus obtained polymer solution and onium salt solution were then mixed together, thus preparing an ink composition 1 containing the charge transport polymer 1. This ink composition 1 was spin-coated at a rotational rate of 3,000 min$^{-1}$ under normal atmospheric conditions onto a glass substrate on which ITO had been patterned with a width of 1.6 mm, and the glass substrate was then heated at 140° C. for 10 minutes on a hot plate, thus forming a hole injection layer (20 nm).

Next, the charge transport polymer 3 (10.0 mg) and toluene (1.145 mL) were mixed together to prepare an ink composition 2. This ink composition 2 was spin-coated at a rotational rate of 3,000 min$^{-1}$ onto the above hole injection layer, and was then dried by heating at 180° C. for 10 minutes on a hot plate, thus forming a hole transport layer (40 nm). The hole transport layer was able to be formed without dissolving the hole injection layer.

Subsequently, the glass substrate was transferred into a vacuum deposition apparatus, layers of CBP:Ir(ppy)$_3$ (94:6, 30 nm), BAlq (10 nm), Alq$_3$ (30 nm), LiF (0.8 nm) and Al (100 nm) were deposited in that order using vapor deposition methods on top of the hole transport layer, and a sealing treatment was then performed to complete production of an organic EL element.

Comparative Example 3

With the exception of replacing the charge transport polymer 1 with the charge transport polymer 2, an organic EL element was produced in the same manner as Example 3. The hole injection layer partially dissolved during formation of the hole transport layer, and a multilayer structure could not be formed.

When a voltage was applied to the organic EL elements obtained in Example 3 and Comparative Example 3, green light emission was confirmed in each case. For each element, the drive voltage and emission efficiency at an emission luminance of 1,000 cd/m$^2$ and the emission lifespan (luminance half-life) when the initial luminance was 5,000 cd/m$^2$ were measured. The measurement results are shown in Table 5.

TABLE 5

| | Drive voltage (V) | Emission efficiency (cd/A) | Emission lifespan (h) |
|---|---|---|---|
| Example 3 | 7.2 | 30.0 | 303 |
| Comparative Example 3 | 8.2 | 27.0 | 157 |

In the organic EL element of Example 3, by including an organic layer having excellent solvent resistance upon low-temperature heating (140° C.), a multilayer structure was able to be formed. The organic EL element of Example 3 exhibited a longer emission lifespan than that of the organic EL element of Comparative Example 3. Moreover, in the organic EL element of Example 3, effects that yielded a reduction in the drive voltage and an improvement in the emission efficiency were also obtained.

By using the organic electronic material that represents an embodiment of the present invention, a broad process margin can be ensured in wet processes, and superior organic electronic elements can be produced.

The present invention is related to the subject matter disclosed in prior Japanese Patent Application 2017-131159 filed on Jul. 4, 2017, the entire contents of which are incorporated by reference herein.

REFERENCE SIGNS LIST

1: Light-emitting layer
2: Anode
3: Hole injection layer
4: Cathode
5: Electron injection layer
6: Hole transport layer
7: Electron transport layer
8: Substrate

The invention claimed is:

1. An organic electronic material comprising a charge transport polymer, wherein
the charge transport polymer has, at a terminal, an aromatic ring having two polymerizable functional groups and includes an aromatic ring represented by a formula shown below:

[Chemical formula 1]

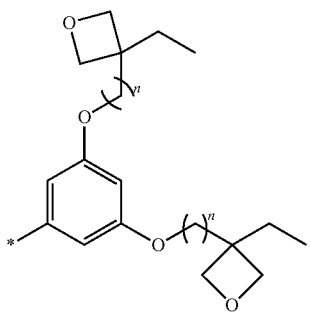

wherein each n independently represents an integer of 1 to 6.

2. The organic electronic material according to claim 1, wherein the charge transport polymer is a hole transport polymer.

3. The organic electronic material according to claim 1, wherein the charge transport polymer has a structure that is branched in three or more directions.

4. The organic electronic material according to claim 1, wherein the charge transport polymer has a structural unit having charge transport properties, and the structural unit having charge transport properties includes at least one type of structural unit selected from the group consisting of a divalent structural unit L represented by the following formula in which L is a structural unit that has charge transport properties:

*-L-* and a trivalent or higher structural unit B represented by any one of the following formulae in which B is a structural unit that has charge transport properties:

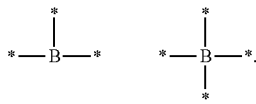

5. The organic electronic material according to claim 4, wherein the structural unit having charge transport properties has at least one type of structure selected from the group consisting of an aromatic amine structure, a carbazole structure, a thiophene structure, a bithiophene structure, a benzene structure, a phenoxazine structure and a fluorene structure.

6. The organic electronic material according to claim 1, further comprising a polymerization initiator.

7. The organic electronic material according to claim 6, wherein the polymerization initiator comprises an onium salt.

8. The organic electronic material according to claim 1, wherein the charge transport polymer is a branched charge transport polymer.

9. The organic electronic material according to claim 1, wherein n is 1.

10. The organic electronic material according to claim 4, wherein trivalent or higher structural unit B includes an aromatic amine structure.

11. An ink composition comprising the organic electronic material according to claim 1, and a solvent.

12. An organic layer formed from the organic electronic material according to claim 1.

13. An organic electronic element comprising the organic layer according to claim 12.

14. An organic electroluminescent element comprising the organic layer according to claim 12.

15. A display element comprising the organic electroluminescent element according to claim 14.

16. An illumination device comprising the organic electroluminescent element according to claim 14.

17. A display device comprising the illumination device according to claim 16, and a liquid crystal element as a display unit.

18. An organic layer formed from the ink composition according claim 11.

* * * * *